(12) United States Patent
Koyata et al.

(10) Patent No.: US 8,759,229 B2
(45) Date of Patent: Jun. 24, 2014

(54) METHOD FOR MANUFACTURING EPITAXIAL WAFER

(75) Inventors: Sakae Koyata, Tokyo (JP); Kazushige Takaishi, Tokyo (JP); Tomohiro Hashii, Tokyo (JP); Katsuhiko Murayama, Tokyo (JP); Takeo Katoh, Tokyo (JP)

(73) Assignee: Sumco Corporation, Tokyo (JP)

( * ) Notice: Subject to any disclaimer, the term of this patent is extended or adjusted under 35 U.S.C. 154(b) by 922 days.

(21) Appl. No.: 12/162,732

(22) PCT Filed: Jan. 24, 2007

(86) PCT No.: PCT/JP2007/051031
§ 371 (c)(1),
(2), (4) Date: Jul. 30, 2008

(87) PCT Pub. No.: WO2007/088754
PCT Pub. Date: Aug. 9, 2007

(65) Prior Publication Data
US 2009/0053894 A1 Feb. 26, 2009

(30) Foreign Application Priority Data
Jan. 31, 2006 (JP) ................ 2006-021902

(51) Int. Cl.
*H01L 21/302* (2006.01)
(52) U.S. Cl.
USPC ........... 438/745; 438/459; 438/691; 438/692; 438/697; 438/747; 438/748; 438/753; 216/2; 216/88; 216/101
(58) Field of Classification Search
CPC ........ G01B 11/06; C30B 25/02; C30B 25/18; C30B 29/06; H01L 22/12; H01L 22/26; H01L 21/02008; H01L 21/02019; H01L 21/02381; H01L 21/02532; H01L 21/02573; H01L 21/0262; H01L 21/02658; H01L 21/30604; H01L 21/6708; H01L 21/67253; H01L 21/67075
USPC ........ 216/2, 88, 101; 438/459, 691, 692, 697, 438/745, 747, 748, 753
See application file for complete search history.

(56) References Cited

U.S. PATENT DOCUMENTS 5,472,562 A 12/1995 Ziger
5,899,744 A * 5/1999 Toyama et al. ............... 438/690

(Continued)

FOREIGN PATENT DOCUMENTS

EP 0451855 10/1991
EP 1313135 5/2003

(Continued)

OTHER PUBLICATIONS

Indian Office Action dated Jan. 18, 2011 that issued with respect to patent family member Indian Patent Application No. 2546/KOLNP/2008.

(Continued)

*Primary Examiner* — Nadine Norton
*Assistant Examiner* — Christopher Remavege
(74) *Attorney, Agent, or Firm* — Greenblum & Bernstein, P.L.C.

(57) ABSTRACT

A method for manufacturing an epitaxial wafer that can reduce occurrence of a surface defect or a slip formed on an epitaxial layer is provided. The manufacturing method is characterized by comprising: a smoothing step of controlling application of an etchant to a wafer surface in accordance with a surface shape of a silicon wafer to smooth the wafer surface; and an epitaxial layer forming step of forming an epitaxial layer formed of a silicon single crystal on the surface of the wafer based on epitaxial growth.

7 Claims, 7 Drawing Sheets

(56) References Cited

U.S. PATENT DOCUMENTS

| | | | |
|---|---|---|---|
| 6,096,233 | A | 8/2000 | Taniyama et al. |
| 6,234,873 | B1 | 5/2001 | Yamamoto et al. |
| 6,294,469 | B1* | 9/2001 | Kulkarni et al. ............ 438/689 |
| 6,793,836 | B2* | 9/2004 | Tsung-Kuei et al. ........... 216/83 |
| 6,897,964 | B2* | 5/2005 | Takahashi et al. ........... 356/503 |
| 7,282,190 | B2 | 10/2007 | Mizutani et al. |
| 7,972,969 | B2* | 7/2011 | Yang et al. .................... 438/748 |
| 2002/0062840 | A1* | 5/2002 | Verhaverbeke et al. ....... 134/1.3 |
| 2002/0127766 | A1* | 9/2002 | Ries et al. ....................... 438/94 |
| 2003/0171075 | A1 | 9/2003 | Nihonmatsu et al. |
| 2004/0108297 | A1* | 6/2004 | Erk et al. .......................... 216/2 |
| 2005/0000940 | A1* | 1/2005 | Iwamoto et al. ................ 216/83 |
| 2006/0160336 | A1 | 7/2006 | Mizutani et al. |
| 2009/0053894 | A1 | 2/2009 | Koyata et al. |

FOREIGN PATENT DOCUMENTS

| | | |
|---|---|---|
| JP | 3-295235 | 12/1991 |
| JP | 07-074140 | 3/1995 |
| JP | 11-135464 | 5/1999 |
| JP | 2000-323736 | 11/2000 |
| JP | 2003-059933 | 2/2003 |
| JP | 2003-142434 | 5/2003 |
| JP | 2003-197547 | 7/2003 |
| JP | 2003-197549 | 7/2003 |
| JP | 2003-197547 | 11/2003 |
| JP | 2003-197549 | 11/2003 |
| JP | 2004-063883 | 2/2004 |
| JP | 2004-319717 | 11/2004 |
| JP | 2005-101446 | 4/2005 |
| JP | 2005-175106 | 6/2005 |
| JP | 2002-043255 | 12/2005 |
| JP | 2005-336008 | 12/2005 |
| JP | 2007-204286 | 8/2007 |
| WO | 2005/117079 | 12/2005 |

OTHER PUBLICATIONS

Taiwanese Office Action dated Dec. 22, 2010 that issued with respect to patent family member Taiwanese Patent Application No. 096103383, along with an English language translation thereof.
European Office Action dated Aug. 6, 2010 that issued with respect to patent family member European Patent Application No. 07707282.5.
Korean Office Action dated Jul. 19, 2010 that issued with respect to patent family member Korean Patent Application No. 10-2008-7019163, along with a partial English language translation.
English language Abstract of JP 2002-043255, Dec. 8, 2005 and computer translation.
English language Abstract of JP 2007-204286, Aug. 16, 2007 and computer translation.
English language Abstract of JP 2003-059933, Feb. 28, 2003 and computer translation.
English language Abstract of JP07-074140, Mar. 17, 1995 and computer translation.
English language Abstract of JP2000-323736, Nov. 24, 2000 and computer translation.
English language Abstract of JP2003-197547, Jul. 11, 2003 and computer translation.
English language Abstract of JP2003-197549, Jul. 11, 2003 and computer translation.
English language Abstract of JP2005-336008, Dec. 8, 2005 and computer translation.
Singapore Search Report and Written Opinion dated May 26, 2009 with respect to patent family member Singapore Patent Application No. 2008-05145-0.
Extended European Search Report dated Jun. 19, 2009 with respect to patent family member European Patent Application No. 07707282.5.
China Office action that issued with respect to patent family member Chinese Patent Application No. 200780012151.7, dated Jan. 27, 2011 along with an English translation thereof.
Taiwanese Office Action dated Aug. 20, 2010 that issued with respect to patent family member Taiwanese Patent Application No. 096103383, along with an English language translation thereof.
Chinese Office Action issued Aug. 3, 2011 in patent family member Chinese Application No. 200780012151.7 and English translation thereof.
Japan Office action that issued with respect to patent family member Japanese Patent Application No. 2006-021902, dated Jan. 31, 2012 along with an english translation thereof.
China Office action that issued with respect to patent family member Chinese Patent Application No. 200780012151.7, dated Jan. 6, 2012 along with an english translation thereof.
Office Action in related Japanese Patent Application No. 2006-021902 dated May 22, 2012, along with partial English-language translation.

* cited by examiner

METHOD FOR MANUFACTURING EPITAXIAL WAFER

TECHNICAL FIELD

The present invention relates to a method for manufacturing an epitaxial wafer that applies an etchant to a surface of a semiconductor wafer to smooth the surface, thereby improving efficiency of formation of an epitaxial layer.

BACKGROUND ART

As shown in FIG. 13, in a conventional manufacturing process for an epitaxial layer, a distal end and a proximal end of a grown silicon single crystal ingot are cut off to provide a block shape, an outer diameter of the ingot is ground in order to uniform a diameter of the ingot so that a block body can be obtained, an orientation flat or an orientation notch is formed to this block body to indicate a specific crystal orientation, and then the block body is sliced with a predetermined angle with respect to a rod axis direction (a step 1). A wafer peripheral portion of the sliced wafer is chamfered to avoid a crack or a chip of the wafer peripheral portion (a step 2). Subsequently, double disk surface grinding (which will be referred to as DDSG hereinafter) that allows both front and rear surfaces of the silicon wafer to be ground is applied as a smoothing step (a step 3). Then, single disk surface grinding (which will be referred to as SDSG hereinafter) that allows the front surface alone of the wafer to be ground or allows the front and rear surfaces of the wafer to be ground one by one is carried out (a step 4). Subsequently, double disk surface polishing (which will be referred to as DSP hereinafter) that allows both the front and rear surfaces of the wafer to be simultaneously polished is effected (a step 5). Then, single disk surface polishing (which will be referred to as SMP hereinafter) that allows the front surface alone of the wafer to be polished or allows the front and rear surfaces of the wafer to be polished one by one is carried out (a step 6). Further, when an epitaxial layer made of a silicon single crystal is formed on the surface of the wafer by epitaxial growth (a step 7), a desired epitaxial wafer can be obtained.

However, the conventional manufacturing process has the following problem.

When machining processing, e.g., slicing or grinding is applied, a mechanical damage or a machining scratch is necessarily formed on the wafer. Since an epitaxial layer forming step based on epitaxial growth is a process that emphasizes a scratch or a damage (a distortion of a crystal lattice) present on the wafer surface, a crystal defect, e.g., a dislocation or a stacking fault occurs in the epitaxial layer with a defective part caused due to machining processing such as grinding as a starting point, and this defect is elicited as a surface defect on an epitaxial layer surface in some cases. Furthermore, when a scratch or a machining damage caused due to machining processing is serious, a slip may occur in the formed epitaxial layer. Moreover, since the number of steps to manufacture an epitaxial layer is large, a throughput is reduced and a cost is increased.

In order to solve this problem, there is disclosed a method for manufacturing a silicon epitaxial wafer characterized by performing a vapor growth step of growing a silicon single crystal thin film from vapor on a silicon single crystal substrate; a step of effecting water polishing; and a polishing step using an abrasive in the mentioned order (see, e.g., Patent Document 1). In this method disclosed in Patent Document 1, a silicon single crystal substrate before the vapor growth step is obtained as follows. First, a silicon single crystal ingot is cut into a block, subjected to external-diameter grinding, and then sliced. Subsequently, outer rims on both surfaces of the sliced silicon single crystal wafer are chamfered, and then both the surfaces are lapped by using a loose abrasive. The lapping wafer is immersed in an etchant to chemically etch both the surfaces, thereby obtaining a chemically etched wafer. This chemically etched wafer is determined as the silicon single crystal substrate, and a silicon single crystal thin film is grown from vapor on this substrate. In the method disclosed in Patent Document 1, occurrence of a scratch defect due to a protruding defect formed on the surface of the vapor-grown silicon single crystal thin film can be suppressed, and a height of this protruding defect can be reduced.

Patent Document 1: Japanese Examined Patent Application Publication No. 2002-43255 (claim 1, paragraphs and [0013] to [0015])

DISCLOSURE OF INVENTION

Problem to be Solved by the Invention

However, in the manufacturing method disclosed in Patent Document 1, since immersion type etching is carried out, an entire wafer surface is uniformly etched, control over a removal amount in a wafer plane to effect shape control, e.g., obtaining a predetermined surface shape cannot be performed in a wafer plane, and hence a surface state, e.g., a flatness degree is hard to be improved even though it may become worse before lapping/grinding at the previous step. Further, smoothing processing based on machining, e.g., lapping is applied before vapor growth of the silicon single crystal thin film, a mechanical damage or a processing scratch necessarily occurs on the wafer, and occurrence of a surface defect or a slip formed on an epitaxial layer cannot be sufficiently reduced even though subsequent water polishing or polishing using an abrasive is applied.

It is an object of the present invention to provide a method for manufacturing an epitaxial layer that applies an etchant to a surface of a semiconductor wafer to smooth the surface, thereby reducing occurrence of a surface defect or a slip formed on an epitaxial layer.

Means for Solving Problem

The present inventors have revealed that performing a smoothing step of applying an etchant to a silicon wafer under specific conditions or an epitaxial layer forming step allows reducing occurrence of a surface defect or a slip formed on an epitaxial layer.

The present invention provides a method for manufacturing an epitaxial layer comprising: a smoothing step of controlling application of an etchant in accordance with a surface shape of a silicon wafer to smooth the wafer surface; and an epitaxial layer forming step of forming an epitaxial layer formed of a silicon single crystal on the surface of the wafer based on epitaxial growth.

Effect of the Invention

The method for manufacturing an epitaxial layer according to the present invention can demonstrate an effect that controlling application of an etchant to a wafer surface in accordance with a shape of the wafer surface allows smoothing the wafer surface. Furthermore, since the smoothing processing for the wafer surface is chemical processing that applies an etchant to the wafer without including a mechanical element and a scratch or a damage rarely occurs on the wafer, occurrence of a surface defect or a slip formed on an epitaxial layer due to machining can be decreased.

EXPLANATIONS OF LETTERS OR NUMERALS 11 slicing
12 smoothing processing
13 epitaxial layer formation
14 mirror polishing

BEST MODE(S) FOR CARRYING OUT THE INVENTION

The best mode for carrying out the present invention will now be described with reference to the accompanying drawings.

Figure 1:
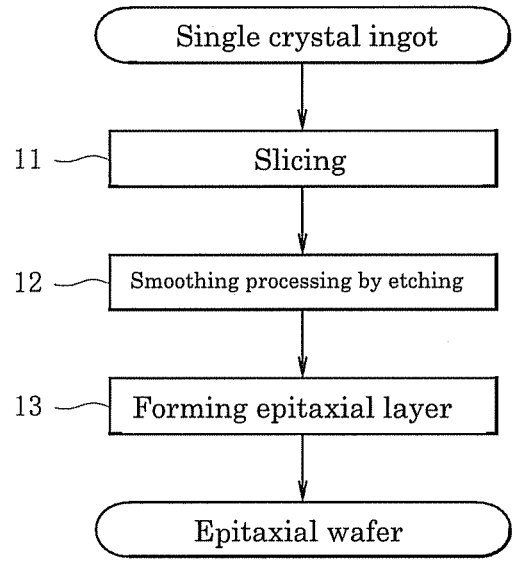
FIG. 1 is a view showing a method for manufacturing an epitaxial wafer according to an embodiment of the present invention.

First, a distal end and a proximal end of a grown silicon single crystal ingot are cut off to provide a block shape, and an external diameter of the ingot is ground to uniform a diameter of the ingot, thereby providing a block body. An orientation flat or an orientation notch is formed to this block body to indicate a specific crystal orientation. After this process, as shown in FIG. 1, the block body is sliced with a predetermined angle with respect to a rod axis direction (a step 11).

Irregular layers on front and rear surfaces of a thin discoid silicon wafer produced in a process such as slicing are ground down by machining, e.g., grinding or lapping to enhance a flatness degree of the front and rear surfaces of the wafer and a parallelism degree of the wafer in a conventional manufacturing process for a wafer, but in a manufacturing method according to this embodiment, this smoothing step based on machining is not performed, and application of an etchant is first controlled in accordance with a silicon wafer surface shape after slicing, whereby the wafer surface is smoothed (a step 12).

At the smoothing step 12, irregular layers on both front and rear surfaces of the silicon wafer produced at a step of, e.g., slicing are smoothed by etching to enhance a flatness degree of the front and rear surfaces of the wafer and a parallelism degree of the wafer. Furthermore, an affected layer introduced due to a machining process, e.g., block cutting, external-diameter grinding, or the slicing step 11 is completely removed. Moreover, the use of an acid etchant as an etchant utilized in smoothing allows controlling surface roughness of the wafer.

Figure 4:
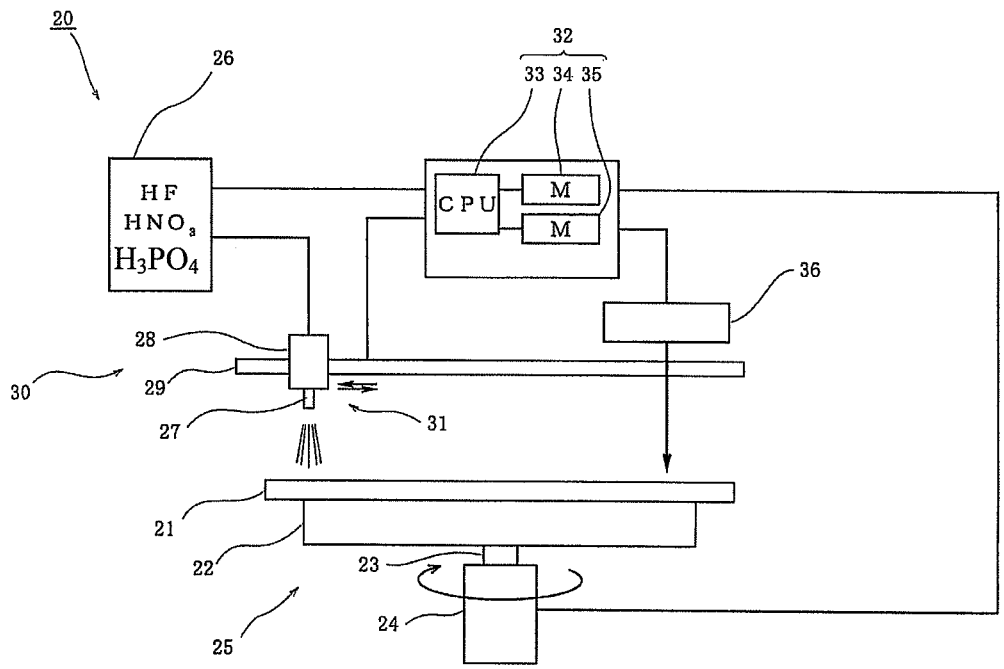
FIG. 4 is a view showing a single-wafer processing type etching device.
Figure 5:
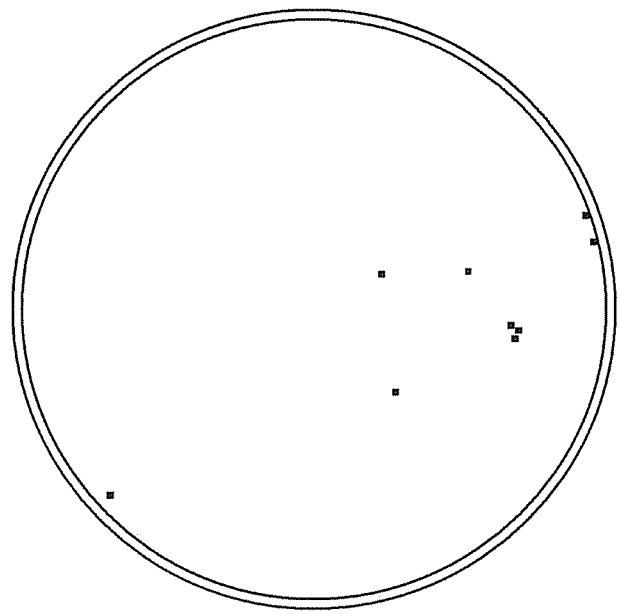
FIG. 5 is a view showing a surface defect evaluation result in a surface layer of an epitaxial layer according to Example 1.
Figure 6:
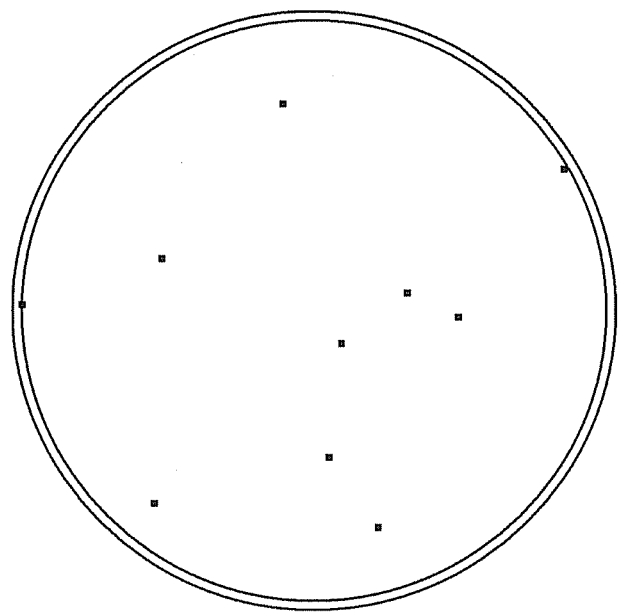
FIG. 6 is a view showing a surface defect evaluation result in a surface layer of an epitaxial layer according to Example 2.
Figure 7:
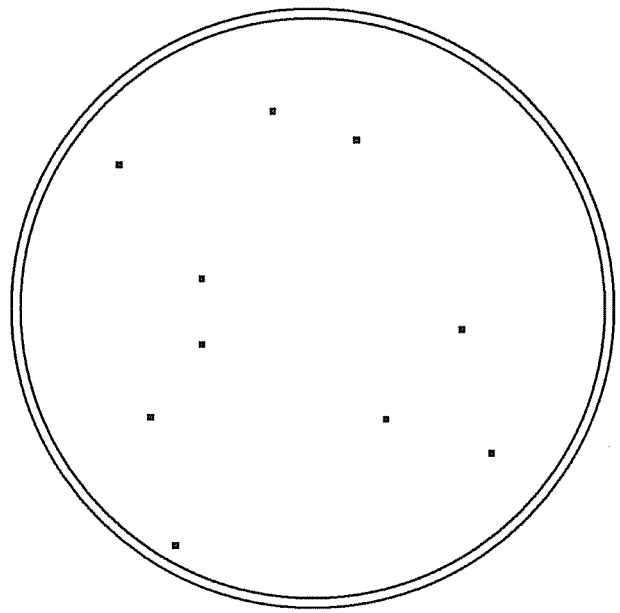
FIG. 7 is a view showing a surface defect evaluation result in a surface layer of an epitaxial layer according to Example 3.
Figure 8:
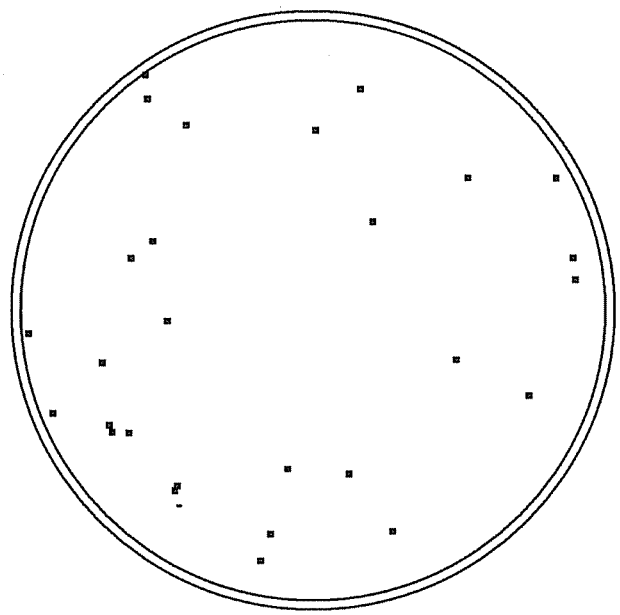
FIG. 8 is a view showing a surface defect evaluation result in a surface layer of an epitaxial layer according to Comparative Example 1.

This smoothing step 12 is carried out by using such an etching device 20 as shown in FIG. 4.

The single-wafer processing etching device 20 depicted in FIG. 4 has a stage 22 that supports a wafer 21, and a rotation driving source 24, e.g., a motor that is connected with the stage 22 via a rotary shaft 23 and drives the stage 22 to rotate through the rotary shaft 23, and these members constitute wafer rotating means 25.

Moreover, the single-wafer processing etching device 20 has etchant supplying means 26 for supplying an etchant, a nozzle 27 that receives the etchant from this etchant supplying means 26 and belches out the etchant to the wafer 21, a nozzle base portion 28 that movably supports this nozzle 27, and a guide portion 29 that restricts a position/movement of the nozzle base portion 28, and these members constitute nozzle position controlling means 30. To the nozzle base portion 28 are provided a mechanism that adjusts an angle of the nozzle 27 with respect to the nozzle base portion 28, a mechanism that adjusts a height position of a distal end of the nozzle 27 from the wafer 21, and a mechanism that switches discharge/non-discharge of the etchant from the nozzle 27, and these members constitute discharge state controlling means 31.

Additionally, the single-wafer processing etching device 20 has controlling means 32 that controls the number of revolutions of the rotation driving source 24 to set a water revolution number, controls the etchant supplying means 26 to specify a supply state of the etchant, and controls the nozzle position controlling means 30 and the discharge state controlling means 31 to set a state/a position of the nozzle 27. This controlling means 32 has an arithmetic portion 33, e.g., a CPU and a plurality of memories 34, 35 . . . . Reference numeral 36 denotes wafer surface detecting means that utilizes laser reflection on the wafer surface based on a laser reflection mode to measure irregularities on the wafer surface. The detecting means 36 may measure a wafer surface shape as an independent device without being disposed in the single-wafer processing etching device 20.

The etchant supplying means 26 supplies an acid etchant to the nozzle 27. The etchant supplying means 26 may previously mix acids at a predetermined mixing ratio to prepare the acid etchant and then supply the acid etchant to the nozzle 31, or it may separately supply acids to the nozzle 31 and then mix them near the nozzle 31.

In the nozzle position controlling means 30, the guide portion 29 that restricts movement of the nozzle base portion 28 runs through a rotational center of the wafer 21 and supports the nozzle base portion 28 so that the nozzle 27 can move in a radial direction of the wafer 21. The guide portion 29 may have a configuration by which the nozzle base portion 28 can move in a length direction thereof. A position of the nozzle 27 with respect to the rotational center of the wafer 21 can be set based on a movement position of the nozzle base portion 28 in the length direction of the guide portion 29. The nozzle base portion 28 has a mechanism that moves in the length direction of the guide portion 29.

Further, the guide portion 29 may have a structure in which one end thereof is provided to run through the rotational center of the wafer 21 whilst the other end thereof is supported to be rotatable in a horizontal direction and the nozzle 27 that moves when the guide portion 29 is horizontally swiveled can move in an in-plane direction of the wafer 21.

The discharge state controlling means 31 has angle adjusting means that is provided at the nozzle base portion 28 and adjusts an angle of the nozzle 27 with respect to the nozzle base portion 28, height adjusting means for adjusting a height position of the distal end of the nozzle 27 from the wafer 21, and a valve body that switches discharge/non-discharge of the etchant from the nozzle 27. Furthermore, supply from the etchant supplying means 26 may be switched without providing the valve body.

The controlling means 32 has at least a memory that stores a surface shape of the wafer 21 before processing, a memory that stores a position of the nozzle 27 and an etching state, a memory that stores a discharge amount of the etchant and an etching state, and a memory that stores a shape of the wafer 21 serving as a reference after processing as the memories 34, 35 . . . , and has the arithmetic portion 33 that calculates these contents to obtain movement of the nozzle 27 and a discharge state of the etchant. It is to be noted that the memories 34 and 35 use the detecting means 36 to detect a surface status of the wafer 21 before processing, and store this data. Incidentally, in regard to this memory data, the detecting means may detect a surface status in accordance with each wafer to be processed and resultant data may be stored, or the detecting means may detect a surface status every given number of wafers on behalf of other wafers and resultant data may be stored, or a convex portion of a given wafer may be detected in accordance with each ingot, or data defined in accordance with each category of wafers may be used.

In order to smooth the wafer 21 in the single-wafer processing etching device 20 according to this embodiment, the detecting means 36 is first used to divide a surface of the wafer 21 into a plurality of regions and measure a surface shape, this detection data is input to the controlling means 32 for controlling a shape of the wafer 21, and this detection data is stored in the memories 34 and 35.

Then, the wafer 21 is supported on the stage 22, and the rotation driving source 24 drives this stage 22 to rotate under control by the controlling means 32.

Furthermore, the controlling means 32 allows the etchant supplying means 26 to supply an etchant having a predetermined composition to the nozzle 27, controls the nozzle position controlling means 30 and the discharge state controlling means 31 to control a state/a position and a discharge time of the nozzle 27 so that the etchant is belched out to the wafer 21.

Horizontal movement of the nozzle 27 is carried out by oscillation along an arc described by horizontal driving over the nozzle 27 in a radial direction of the wafer from the wafer center at a speed of approximately 0.1 to 20 mm/second with an end of the nozzle 27 being determined as a supporting point, or carried out by reciprocation in the radial direction of the wafer from the wafer center. The etchant supplied to an upper surface of the wafer 21 gradually moves from a water center side toward a wafer outer rim side by a centrifugal force of rotation of the wafer while etching an affected layer on the wafer surface, and scatters as droplets from the outer rim of the wafer.

The etchant used at the smoothening step 12 is an aqueous solution containing hydrofluoric acid, nitric acid, and phosphoric acid. Moreover, a mixing ratio of hydrofluoric acid, nitric acid, and phosphoric acid contained in the aqueous solution is defined as hydrofluoric acid:nitric acid:phosphoric acid=0.5 to 40%:5 to 50%:5 to 70% in weight %. When this mixing ratio is adopted, a viscosity degree of the etchant becomes 2 to 40 mPa·sec and a surface tension of the etchant becomes 50 to 70 dyne/cm, and hence this is preferable to improve flatness degrees of front and rear surfaces of the wafer and a parallelism degree of the wafer. When the viscosity degree is less than a lower limit value, the viscosity of the liquid is too low, the etchant that has dropped onto the upper surface of the wafer is immediately blown out from the wafer surface by the centrifugal force, and the etchant cannot uniformly and sufficiently come into contact with the wafer surface, whereby assuring a sufficient etching removal amount takes time, resulting in a reduction in productivity. When the viscosity degree exceeds an upper limit value, the etchant that has dropped onto the wafer surface stays on the wafer supper surface for a long time beyond necessity, and hence an in-plane and an outer peripheral shapes of the wafer cannot be controlled, resulting in an inconvenience of deterioration in the wafer flatness degree. When the surface tension is less than the lower limit value, the etchant that has dropped onto the wafer upper surface is immediately blown out from the wafer surface by the centrifugal force, it cannot uniformly and sufficiently come into contact with the wafer surface, whereby assuring a sufficient etching removal amount takes time, resulting in a reduction in productivity. When the surface tension exceeds an upper limit value, the etchant that has dropped onto the wafer surface stays on the wafer upper surface for a long time beyond necessity, and hence an in-plane and an outer peripheral shapes of the wafer cannot be controlled, resulting in an inconvenience of deterioration in the wafer flatness degree. As a mixing ratio of hydrofluoric acid, nitric acid, phosphoric acid, and water contained in the etchant, 5 to 20%:20 to 40%:20 to 40%:20 to 40% is preferable. When this mixing ratio is adopted, a viscosity degree of the etchant becomes 10 to 20 mPa·sec and a surface tension of the etchant becomes 55 to 60 dyne/cm. As a supply amount of the etchant from the nozzle 27, 2 to 30 liters/minute is preferable. 5 to 30 liters/minute is preferable as a supply amount of the acid etchant when a width of the silicon wafer is φ300 mm, and 3 to 20 liters/minute is preferable as a supply amount of the acid etchant when a width of the silicon wafer is φ200 mm.

A rotating speed of the wafer 21 at the smoothing step 12 is defined to fall within a range of approximately 100 to 2000 rpm. It is to be noted that an optimum rotating speed slightly varies depending on a diameter of the wafer 21, a viscosity degree of the etchant, a supply position of the etchant based on horizontal movement of the nozzle 27, or a supply flow rate of the etchant to be supplied. When the rotating speed is less than a lower limit value, an in-plane and an outer peripheral shapes of the wafer cannot be controlled to result in an inconvenience of deterioration in a wafer flatness degree and, when the rotating speed exceeds an upper limit value, the etchant that has dropped onto the wafer surface is immediately blown out from the wafer surface by the centrifugal force, and it cannot uniformly and sufficiently come into contact with the wafer surface, whereby assuring a sufficient etching removal amount takes time, reducing productivity. When a width of the silicon wafer is φ300 mm, a rotating speed of 200 to 1500 rpm is preferable, and 600 rpm is more preferable. When a width of the silicon wafer is φ200 mm, a rotating speed of 300 to 2000 rpm is preferable, and 800 rpm is more preferable.

Moreover, at this smoothing step 12, when one surface of the wafer is etched and then the other surface of the wafer is etched, a parallelism degree of the wafer required to evenly etch both the front and rear surfaces of the wafer can be enhanced. After etching one surface of the wafer 21, the wafer 21 is spun while supplying a rinse agent, e.g., pure water to the upper surface of the wafer 21 from a non-illustrated rinse agent supply nozzle so that the etchant remaining on the surface of the wafer 21 is removed. After cleaning, in a state where supply of the rinse agent is stopped, the wafer 21 is spun to be dried while supplying an inert gas, e.g., a nitrogen gas. Subsequently, the wafer 21 is turned over, the wafer 21 is held on the stage 22 in such a manner that the surface of the wafer 21 that has not been subjected to etching/cleaning/drying processing becomes an upper surface, and etching processing, rinse agent cleaning processing, and drying processing are likewise carried out.

In regard to an etching removal amount at this smoothing step 12, 10 to 150 μm is preferable as a total removal amount of the front and rear surfaces of the wafer, wherein 5 to 75 μm is a removal amount for one surface. When the etching removal amount is set to fall within this range, a flatness degree of the front and rear surfaces of the wafer and a parallelism degree of the wafer can be enhanced. Additionally, at steps following this smoothing step 12, when mirror polishing is applied, a polishing removal amount at a mirror polishing step can be greatly reduced as compared with that in a conventional wafer manufacturing process. When the etching removal amount is less than a lower limit value, a flatness degree of the front and rear surfaces of the wafer and a parallelism degree of the wafer required as a product cannot be obtained, wafer surface roughness cannot be sufficiently reduced and, when the etching removal amount exceeds an upper limit value, the wafer flatness degree is deteriorated, and productivity in wafer manufacture is degraded. When the smoothing step 12 is carried out under the above-described conditions, a high flatness degree can be achieved without effecting a smoothing step using machining based on grinding or the like that is a necessary step in the conventional wafer manufacturing process.

It is to be noted that the example where the smoothing step using machining based on, e.g., lapping or grinding is omitted has been explained in conjunction with this embodiment, but the sliced wafer may be subjected to lapping processing or surface grinding processing before the smoothing step 12 depending on the wafer shape after slicing in order to reduce a throughput per wafer, e.g., an etching use amount at the smoothing step 12. Even in this case, performing the smoothing step 12 allows reducing occurrence of a surface defect or a slip formed on an epitaxial layer due to machining.

Subsequently, an epitaxial layer formed of a silicon single crystal is formed on the surface of the wafer by epitaxial growth (a step 13). It is preferable for the epitaxial layer to be formed by a CVD method in view of crystallinity or mass productivity thereof, simplicity of a device, easiness of forming various kinds of device structures, and others. Epitaxial growth of silicon by the CVD method is carried out by introducing a raw material gas containing silicon, e.g., $SiCl_4$, $SiHCl_3$, $SiH_2Cl_2$, or $SiH_4$ together with an $H_2$ gas into a reactor and precipitating on the surface of the wafer silicon generated by thermal decomposition or reduction of the raw material gas.

Controlling application of an etchant to the wafer surface in accordance with a shape of the wafer surface in this manner enables accurately smoothing the wafer surface and, since the smoothing processing for the wafer surface is chemical processing of applying an etchant to the wafer without including a mechanical element, occurrence of a surface defect or a slip formed on the epitaxial layer due to machining can be reduced while causing almost no scratch or damage on the wafer. The epitaxial wafer can be obtained in accordance with this embodiment, wherein a difference between a maximum value of a wafer thickness and a minimum value of the same is not greater than 1 μm when an entire surface of the wafer is measured.

Figure 2:
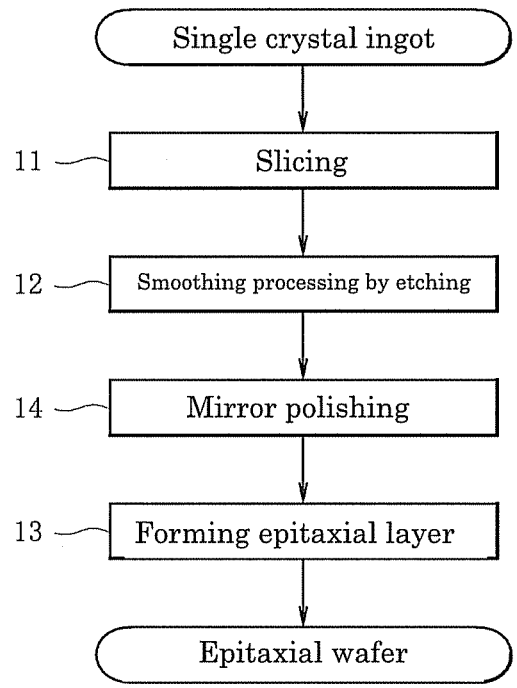
FIG. 2 is a view showing a method for manufacturing an epitaxial wafer according to another embodiment of the present invention.
Figure 3:
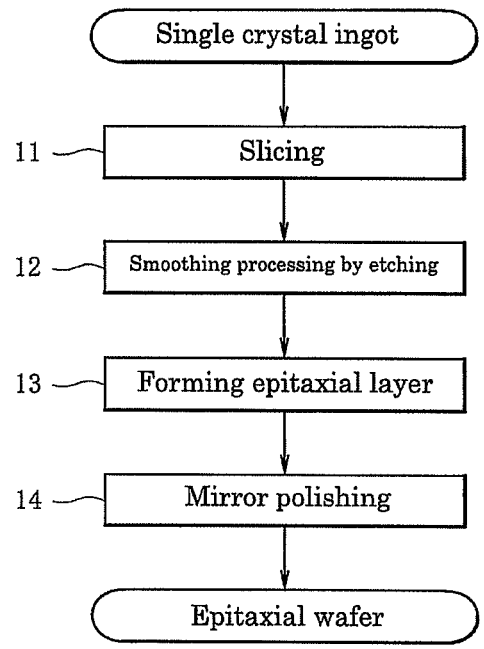
FIG. 3 is a view showing a method for manufacturing an epitaxial wafer according to still another embodiment of the present invention.

Further, according to this embodiment, it is preferable to further include a mirror polishing step 14 between the smoothing step 12 and the epitaxial layer forming step 13 as shown in FIG. 2, or after the epitaxial layer forming step 13 as shown in FIG. 3. Furthermore, since etching as chemical processing is carried out at the smoothing step 12, a grinding mark or undulation generated by effecting mechanical smoothing processing such as grinding is not produced, and hence much polishing removal amount does not have to be taken at the mirror polishing step 14, thus reducing the polishing removal amount. As compared with a conventional manufacturing method, a surface quality can be improved, and occurrence of a surface defect can be further suppressed. The mirror polishing step 14 may be a step based on SMP of polishing the front and rear surfaces of the wafer one by one or a step based on DSP of simultaneously polishing the front and rear surfaces of the wafer. Moreover, in order to improve micro-roughness of a wafer main surface on which a device is formed, SMP may be carried out with respect to the main surface of the wafer subjected to DSP. When performing the mirror polishing 14 between the smoothing step 12 and the epitaxial layer forming step 13, a polishing removal amount that is not smaller than 0.01 μm but not greater than 5 μm per surface is preferable or a polishing removal amount that is not smaller than 0.1 μm but not greater than 1 μm is more preferable per surface in SMP. Additionally, in DSP, a polishing removal amount that is not smaller than 0.5 μm but not greater than 20 μm is preferable or a polishing removal amount that is not smaller than 0.5 μm but not greater than 15 μm is more preferable as a total polishing removal amount on both the front and rear surfaces. Further, when performing DSP after the epitaxial layer forming step 13, a polishing removal amount that is not smaller than 0.02 μm but not greater than 1 μm is preferable or a polishing removal amount that is not smaller than 0.1 μm but not greater than 0.5 μm is more preferable as a total polishing removal amount on both the front and rear surfaces.

It is to be noted that a cleaning step may be of course provided before or after each step in this embodiment. Furthermore, as cleaning after the smoothing step 12 and before the epitaxial layer forming step 13, it is particularly preferable to perform cleaning using a cleaning fluid having an oxidation reducing effect and then carry out cleaning using a hydrofluoric acid solution in order to efficiently remove a remaining ion.

EXAMPLES

Examples according to the present invention will now be described in detail together with comparative examples.

Example 1

A silicon wafer of φ300 mm cut out from a silicon single crystal ingot was first prepared. Then, the single-wafer processing etching device depicted in FIG. 4 was used to perform single-wafer processing etching with respect to the silicon wafer. As an etchant, an acid etchant containing hydrofluoric acid, nitric acid, phosphoric acid, and water at a mixing ratio of hydrofluoric acid:nitric acid:phosphoric acid:water=7%:30%:35%:28% in weights was used. Moreover, a wafer rotating speed and a flow rate of the etchant to be supplied in etching were respectively controlled to 600 rpm and 5.6 liters/minute, and etching was effected for 90 seconds. An etching removal amount in single-wafer processing etching was 30 μm on one surface. After etching, pure water was supplied to the wafer surface to perform cleaning while spinning the wafer, and nitrogen was sprayed to the wafer surface to dry the wafer surface. Subsequently, the wafer was turned over, and single-wafer processing etching was carried out with respect to the rear surface of the wafer under the same conditions.

Then, an epitaxial layer formed of a silicon single crystal was formed with a thickness of 2 μm on the surface of the wafer by epitaxial growth, thus obtaining an epitaxial wafer.

Example 2

A silicon wafer of φ300 mm cut out from a silicon single crystal ingot was first prepared. Then, the single-wafer processing etching device depicted in FIG. 4 was used to perform single-wafer processing etching with respect to the silicon wafer. As an etchant, an acid etchant containing hydrofluoric acid, nitric acid, phosphoric acid, and water at a mixing ratio of hydrofluoric acid:nitric acid:phosphoric acid:water=7%:30%:35%:28% in weight % was used. Moreover, a wafer rotating speed and a flow rate of the etchant to be supplied in etching were respectively controlled to 600 rpm and 5.6 liters/minute, and etching was effected for 90 seconds. An etching removal amount in single-wafer processing etching was 30 μm on one surface. After etching, pure water was supplied to the wafer surface to perform cleaning while spinning the wafer, and nitrogen was sprayed to the wafer surface to dry the wafer surface. Subsequently, the wafer was turned over, and single-wafer processing etching was carried out with respect to the rear surface of the wafer under the same conditions.

Then, SMP of polishing the front and rear surfaces of the wafer subjected to single-wafer processing one by one was carried out. A polishing removal amount based on this SMP was 0.5 μm on one surface, and a total polishing removal amount was 1.0 μm on both the front and rear surfaces. Furthermore, an epitaxial layer formed of a silicon single crystal was formed with a thickness of 2 μm on the surface of the wafer by epitaxial growth, thus obtaining an epitaxial wafer.

Example 3

A silicon wafer of φ300 mm cut out from a silicon single crystal ingot was first prepared. Then, the single-wafer processing etching device depicted in FIG. 4 was used to perform single-wafer processing etching with respect to the silicon wafer. As an etchant, an acid etchant containing hydrofluoric acid, nitric acid, phosphoric acid, and water at a mixing ratio of hydrofluoric acid:nitric acid:phosphoric acid:water=7%:30%:35%:28% in weights was used. Moreover, a wafer rotating speed and a flow rate of the etchant to be supplied in etching were respectively controlled to 600 rpm and 5.6 liters/minute, and etching was effected for 90 seconds. An etching removal amount in single-wafer processing etching was 30 μm on one surface. After etching, pure water was supplied to the wafer surface to perform cleaning while spinning the wafer, and nitrogen was sprayed to the wafer surface to dry the wafer surface. Subsequently, the wafer was turned over, and single-wafer processing etching was carried out with respect to the rear surface of the wafer under the same conditions.

Then, an epitaxial layer formed of a silicon single crystal was formed with a thickness of 2 μm on the surface of the wafer by epitaxial growth, thus obtaining an epitaxial wafer. Moreover, SMP of polishing the front and rear surfaces of this epitaxial wafer one by one was carried out. A polishing removal amount based on this SMP was 0.5 μm on one surface, and a total polishing removal amount was 1.0 μm on both the front and rear surfaces.

Comparative Example 1

A silicon wafer of φ300 mm cut out from a silicon single crystal ingot was first prepared. Then, as a smoothing step, a non-illustrated grinder was used to perform double disk surface grinding (which will be referred to as DDSG hereinafter) with respect to front and rear surfaces of the silicon wafer. A removal amount at this DDSG step was 30 μm on one surface. Subsequently, the non-illustrated grinder was used to perform a single disk surface grinding step (which will be referred to as a SDSG step hereinafter), and a removal amount at this SDSG step was 20 μm on one surface.

Then, DSP of simultaneously polishing the front and rear surfaces of the wafer was effected. A polishing removal amount based on this DSP was 10 μm on one surface, and a total polishing removal amount was 20 μm on both the front and rear surfaces. Subsequently, SMP of polishing the front and rear surfaces of the wafer one by one was carried out. A polishing removal amount based on this SMP was 0.5 μm on one surface, and a total polishing removal amount was 1.0 μm on both the front and rear surfaces. Additionally, an epitaxial layer formed of a silicon single crystal was formed with a thickness of 2 μm on the surface of the wafer by epitaxial growth, thereby obtaining an epitaxial wafer.

<Comparative Test 1>

A particle measuring device (SP1 manufactured by KLA-Tencor Corporation) was used to measure each particle that is present on the wafer surface and equal to or above 0.09 μm with respect to the epitaxial wafer obtained by each of Examples 1 to 3 and Comparative Example 1. FIGS. 5 to 8 show its result.

As apparent from FIGS. 5 to 8, 9 particles were measured per wafer in Example 1, 11 particles were measured per wafer in Example 2, 10 particles were measured per wafer in Example 3, and 29 particles were measured per wafer in Comparative Example 1, respectively. In the wafers according to Examples 1 to 3, there is no large difference in surface defect density irrespective of a wafer that was not subjected to mirror polishing or a wafer that was subjected to mirror polishing, and hence excellent results were obtained. On the other hand, in Comparative Example 1, although a large defect like a slip was not observed, it was revealed that there is a difference in surface defective density when microscopically compared.

<Comparative Test 2>

A non-contact surface roughness meter (MP3100 manufactured by Chapman) was used to measure wafer surface roughness with respect to the epitaxial wafer obtained by each of Examples 1 to 3 and Comparative Example 1. Table 1 shows its result.

TABLE 1

| | Surface roughness Ra[Angstrom] |
|---|---|
| Example 1 | 1.1 |
| Example 2 | 0.9 |
| Example 3 | 0.8 |
| Comparative Example 1 | 1.3 |

As apparent from Table 1, in the wafer according to Example 1 formed without the smoothing step based on machining, a result of the surface roughness smaller than that of the wafer according to Comparative Example 1 as a conventional method was obtained. Further, in each of the wafer according to Example 2 and the wafer according to Example 3 subjected to mirror polishing, the surface roughness is smaller than that of the wafer according to Example 1 that was not subjected to mirror polishing, and it was revealed that an excellent result can be obtained when mirror polishing is carried out.

<Comparative Test 3>

Figure 9:
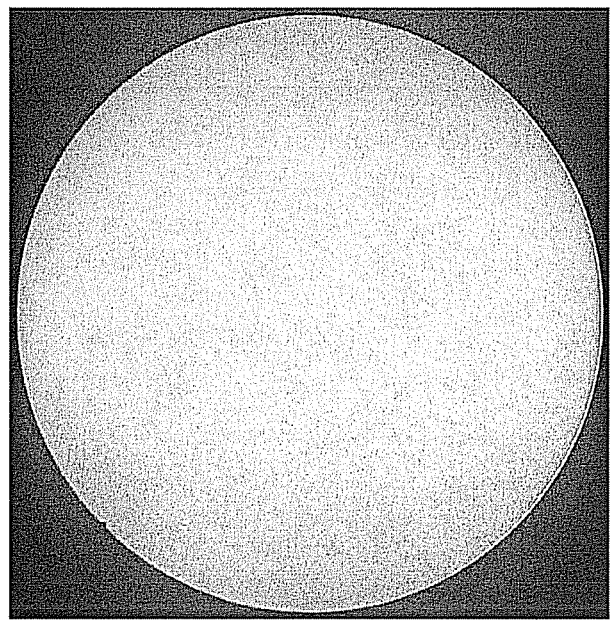
FIG. 9 is a view showing a topograph of the epitaxial wafer according to Example 1 imaged based on X-ray topography.
Figure 10:
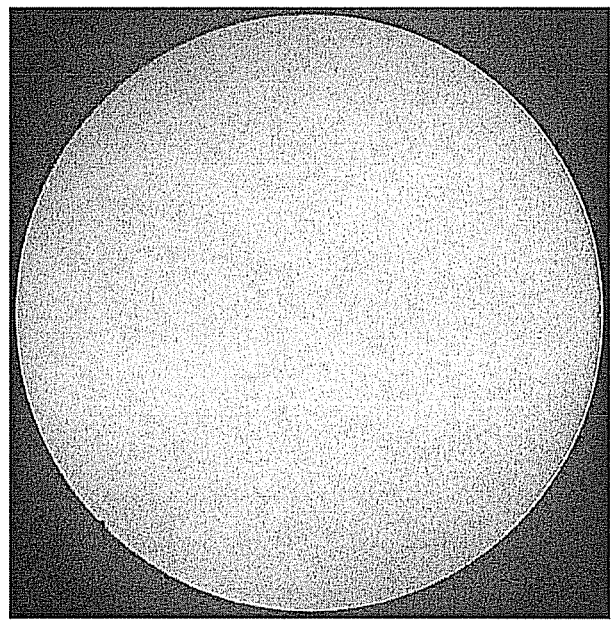
FIG. 10 is a view showing a topograph of the epitaxial wafer according to Example 2 imaged based on X-ray topography.
Figure 11:
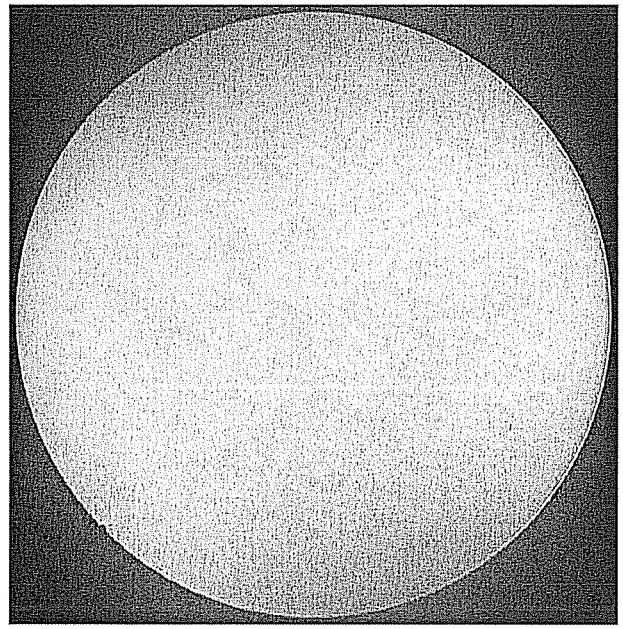
FIG. 11 is a view showing a topograph of the epitaxial wafer according to Example 3 imaged based on X-ray topography.
Figure 12:
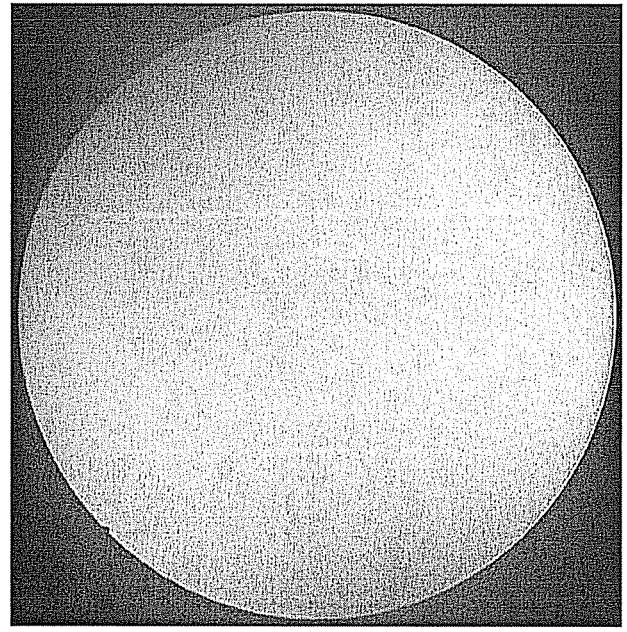
FIG. 12 is a view showing a topograph of the epitaxial wafer according to Comparative Example 1 imaged based on X-ray topography.
Figure 13:
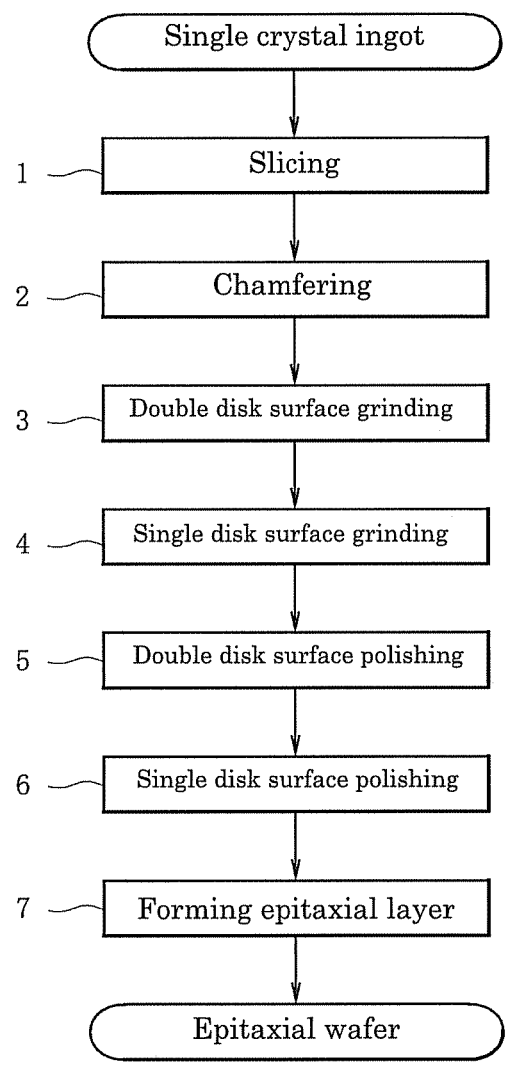
FIG. 13 is a view showing a conventional method for manufacturing an epitaxial wafer.

The epitaxial wafer obtained in each of Examples 1 to 3 and Comparative Example 1 was imaged based on X-ray topography. FIGS. 9 and 12 show obtained topographs.

As apparent from FIGS. 9 to 12, a large defect, e.g., a slip or a dislocation that can be observed based on X-ray topography was not observed in all the epitaxial wafers according to Examples 1 to 3 and Comparative Example 1.

INDUSTRIAL APPLICABILITY

The method for manufacturing an epitaxial wafer according to the present invention can efficiently form an epitaxial layer by applying an etchant to a surface of a semiconductor wafer to smooth the surface.

The invention claimed is:

1. A method for manufacturing an epitaxial wafer comprising:
   smoothing a surface of a single thin discoid wafer obtained by slicing a silicon single crystal ingot; and
   forming an epitaxial layer formed of a silicon single crystal on the smoothed surface of the wafer based on epitaxial growth,
   wherein said smoothing comprises:
      detecting irregularities on an unsmoothed and unetched front surface of the wafer with a detector;
      storing the detected irregularities in memory of a controller;
      controlling a position and a discharge time of a nozzle for supplying an acid etchant in accordance with the stored irregularities on the unsmoothed and unetched front surface of the wafer by said controller;
      rotating the wafer in a horizontal direction;
      supplying the acid etchant from the nozzle to the unsmoothed and unetched front surface of the rotating wafer to spread the supplied etchant on the entire front surface of the wafer by a centrifugal force;
      rinsing and drying the front surface of the wafer;
      subsequently turning over the wafer with the dried front surface; and
      processing an unsmoothed and unetched rear surface of the wafer in a same manner as said detecting, said storing, said controlling, said rotating, said supplying, and said rinsing and drying, thereby smoothing the front surface and rear surface of the wafer.

2. The method for manufacturing an epitaxial wafer according to claim 1, further comprising mirror polishing between said smoothing and said epitaxial layer forming or after said epitaxial layer forming.

3. The method for manufacturing an epitaxial wafer according to claim 1, wherein the acid etchant is an aqueous solution constituted of hydrofluoric acid, nitric acid, and phosphoric acid and containing hydrofluoric acid, nitric acid, and phosphoric acid at a mixing ratio of hydrofluoric acid: nitric acid:phosphoric acid=0.5 to 40%:5 to 50%:5 to 70% by weight.

4. The method for manufacturing an epitaxial wafer according to claim 2, wherein the acid etchant is an aqueous solution constituted of hydrofluoric acid, nitric acid, and phosphoric acid and containing hydrofluoric acid, nitric acid, and phosphoric acid at a mixing ratio of hydrofluoric acid: nitric acid:phosphoric acid=0.5 to 40%:5 to 50%:5 to 70% by weight.

5. The method for manufacturing an epitaxial wafer according to claim 1, wherein, when an entire surface of a manufactured epitaxial wafer is measured, a difference between a maximum value and a minimum value of a thickness of the wafer is not greater than 1 µm.

6. The method for manufacturing an epitaxial wafer according to claim 2, wherein, when an entire surface of a manufactured epitaxial wafer is measured, a difference between a maximum value and a minimum value of a thickness of the wafer is not greater than 1 µm.

7. The method for manufacturing an epitaxial wafer according to claim 3, wherein, when an entire surface of a manufactured epitaxial wafer is measured, a difference between a maximum value and a minimum value of a thickness of the wafer is not greater than 1 µm.

* * * * *